(12) United States Patent
Roberts et al.

(10) Patent No.: US 6,776,887 B2
(45) Date of Patent: Aug. 17, 2004

(54) METHOD AND APPARATUS FOR THIN FILM CENTER SHIELDING

(75) Inventors: Gregory D. Roberts, Breckenridge, MN (US); Richard F. Willson, Hudson, WI (US)

(73) Assignee: Imation Corp., Oakdale, MN (US)

( * ) Notice: Subject to any disclaimer, the term of this patent is extended or adjusted under 35 U.S.C. 154(b) by 255 days.

(21) Appl. No.: 10/112,986

(22) Filed: Mar. 29, 2002

(65) Prior Publication Data

US 2003/0185978 A1 Oct. 2, 2003

(51) Int. Cl.$^7$ .......................... C23C 14/34; B05C 13/00; B23Q 1/25
(52) U.S. Cl. .............................. 204/298.15; 204/298.11; 427/445; 118/501; 118/504; 269/55; 269/287
(58) Field of Search ....................... 204/298.11, 298.15; 118/501, 504; 427/455; 269/55, 287

(56) References Cited

U.S. PATENT DOCUMENTS 5,954,929 A * 9/1999 Uchiyama et al. ..... 204/298.11
6,083,364 A * 7/2000 Ikeda et al. ............ 204/298.11

* cited by examiner

*Primary Examiner*—Steven Versteeg
(74) *Attorney, Agent, or Firm*—Eric D. Levinson

(57) ABSTRACT

A carrier (20) is used in the thin film coating of disks (35). The disks (35) are held in a disk tray (30). The disks (35) have a center (35a) through which the thin film coating can go through. The carrier (20) includes a base plate (21) for receiving the disk tray (30). A plurality of discrete shields (24) are positioned in alignment with the center openings of the disk (35). The shields (24) are releasably connected to the base plate (21). Preferably, the shields (24) are releasably connected by a magnetic force.

19 Claims, 6 Drawing Sheets

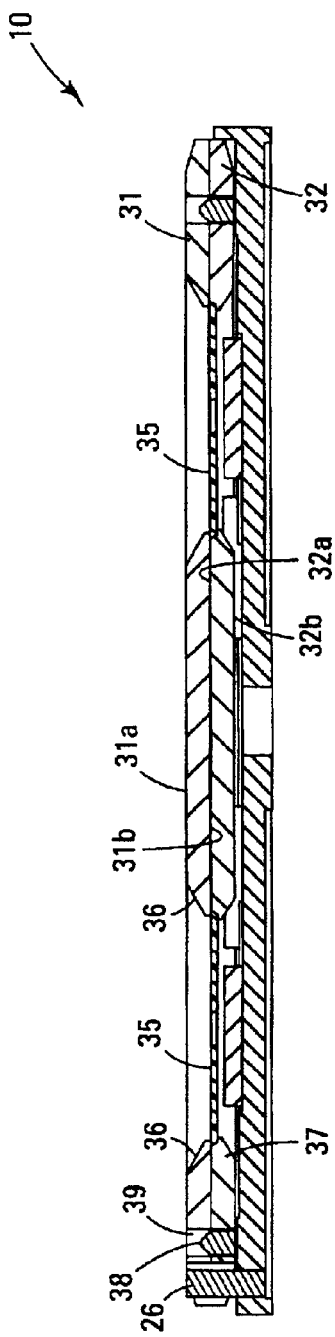
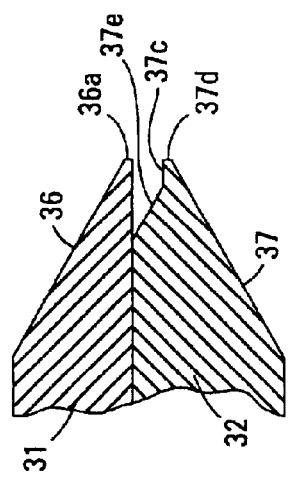
Fig. 5
Fig. 5a

METHOD AND APPARATUS FOR THIN FILM CENTER SHIELDING

BACKGROUND OF THE INVENTION

1. Field of the Invention

This invention relates generally to the shielding of a disk during thin film coating, and more particularly to using discrete releasably connected shields.

2. Description of the Prior Art

Media disks are coated by a thin film coater, which is well known in the art. An example of a suitable coater is the Unaxis Big Sprinter Coater manufactured by Unaxis located at Balzers, Liechtenstein. The thin film coater has an automated disk loader mechanism. This disk loader mechanism has a double ended transfer arm that transfers a single disk with a metal ID and OD mask from the vacuum coater to a position where the thin film coated disk can be picked from the ID and OD mask and replaced with an uncoated disk. The removal of the thin film coated disk from this position and replacement of it with a not thin film coated disk can be done by human hand, but is typically done by external automated disk handling equipment that is not part of the disk coater. On each thin film machine cycle, the thin film coated disk is replaced with an uncoated disk. The ID and OD metallic masks are not replaced until the thin film coatings have built up to an extent that they begin to flake from the metallic mask or the extent that the ID mask has increased in size or the OD mask opening has decreased in size as to not allow thin films to coat an adequate surface area of the disk. At this point, the ID and OD masks with thin film coating build up are replaced with masks that have had the thin film coating removed. The ID mask covers part of the ID surface area and the disk ID center hole thereby preventing sputtering material from going through the disk ID center hole and building up thin film coating on the carrier. The 120 mm disks are typically coated and masked on only one side.

It is no longer necessary or desirable to always have disks of 120 mm in diameter. New technology has become available which is able to utilize a disk of 32 mm in diameter. Since these are substantially smaller, multiples of the small disks are coated at once. Six small disks may be placed in a disk tray. The disk tray is used to hold the smaller disks and mask the outer diameter of the smaller disk. On these small disks, it is not necessary or preferred to mask the ID surface area of the disks. No center masks are used to prevent sputtered material from going through the disk ID center hole and building up on the carrier. A prior art carrier is shown in FIG. 6. The carrier 100 is a carrier of the type used in a thin film coater such as a Unaxis coater. The carrier 100 has a base plate 101. On top of base plate 101 is mounted a ring shaped shield 102. The shield 102 is secured to the base plate 101 by three screws 103. The central portion of the ring 103 is positioned so that it is directly in alignment with the center hole of the disks to be coated. The shield 102 is positioned in a recess in the base plate 101, so that the top surface of the shield 102 is at the same elevation as the top surface of the base plate 101. Magnets 104 are positioned and secured in the base plate 101 and are used to secure the disk tray to the carrier 100. Mounting holes 105 and 106 are provided to mount the carrier 100 to the coater (not shown). Therefore, the sputtering that goes through the center opening of the disk causes a spray pattern, in theory, to land on the shield 102. However, the shield 102 is typically not wide enough and the circular spray pattern will extend on to the base plate 101. Further, when the sputtering builds up sufficiently to require that the shield 102 be replaced, it is necessary that the screws 103 be removed. Still further, when in the coater, any disk tray would have to be removed to allow access to the screws 103 to remove the shield 102.

SUMMARY OF THE INVENTION

In one embodiment, the invention is a carrier for use in thin film coating of disks. The disks are held in a disk tray. The disks have a center opening through which the thin film coating can go through. The carrier includes a base plate for receiving the disk tray. A plurality of discrete shields are releasably connected to the base plate. The shields are positioned in alignment with the center opening of the disks.

In another embodiment, the invention is a carrier and disk tray combination. The disk tray is for holding a plurality of disks for thin film coating. The disks have a center opening. The combination includes a disk tray having a plurality of openings for receiving the disks. A carrier is provided for holding the disk tray during coating. A plurality of discrete shields are releasably connected to the carrier. The shields are positioned in alignment with the center openings of the disks, wherein a spray pattern of sputtering during coating is received on the shields.

In another embodiment, the invention is a carrier and disk tray combination, the disk tray holds a plurality of disks for thin film coating. The disks have a center opening. The combination includes a disk tray having a plurality of openings for receiving the disks. A carrier is provided for holding the disk tray during coating. A plurality of discrete shields are releasably connected to the carrier, the shields are positioned in alignment with the center openings of the disks, wherein a spray pattern of sputtering during the coating is received on the shields. The shields are sized less than the openings in the disk tray, wherein the shields are replaceable when the carrier and disk tray combination is assembled.

In another embodiment, the invention is a method of replacing shields on a carrier of a thin film coater. The carrier holds a disk tray during coating. The disk tray has a plurality of openings to hold a plurality of disks, each disk having a central opening. The method includes releasably connecting a plurality of shields to the carrier, the shields in alignment with the central openings of the disk. The disk tray is loaded, with the disks, onto the carrier. The disks are coated and the shields collect the coating going through the central openings. A disk tray is loaded, without disks, onto the carrier. The carrier and disk tray is moved into the coater. Then, one reaches in through the opening of the disk tray and removes the shields and replaces the plurality of shields with coating with a plurality of shields with no coating and releasably connects the second plurality of shields to the carrier.

BRIEF DESCRIPTION OF THE DRAWINGS

FIG. 5 is a cross sectional view of an assembled carrier and disk tray;

FIG. 5a is an enlarged cross sectional view of a portion of the assembled carrier and disk tray shown in FIG. 5.

DETAILED DESCRIPTION OF THE PREFERRED EMBODIMENT

Figure 1:
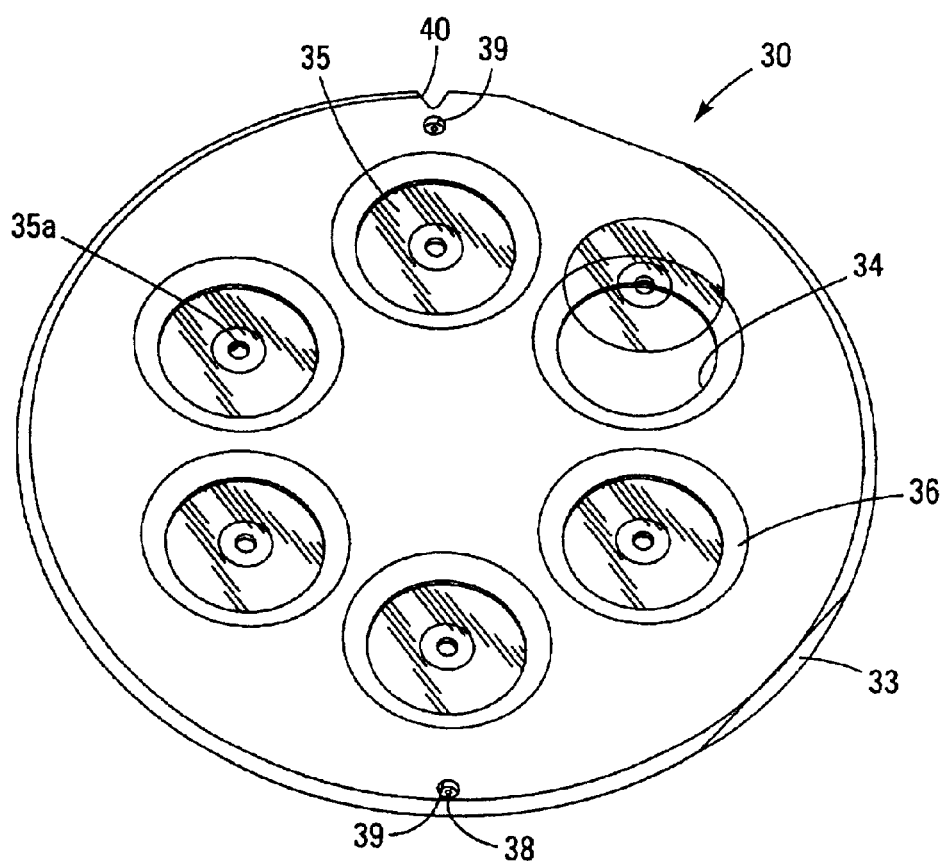
FIG. 1 is a perspective view of the disk tray of the present invention.

FIG. 5 shows a cross sectional view of the combination 10 of the disk tray 30 and the carrier 20. Referring to FIGS. 1 and 5, the disk tray 30 includes a top halt 31 and a bottom half 32. A plurality of magnets (not shown) are embedded in the bottom halt 32. The magnets provide a means of showing the top half 31 to the bottom half 32. A bevel 33 is formed in both the top half 31 and bottom half 32 to provide an angled surface to allow for the halves 31, 32 to be more easily separated. A tool is simply inserted into the bevel 33 and this separates the halves 31, 32 from each other, overcoming the magnetic force. Six openings 34 are formed in the disk tray 30 to receive six disks 35, although it is understood other quantities of disks 35 may be used. The disks 35 are media disks that are coated on both sides by a thin film coating, such coatings well known in the art. The openings 34 extend through both the top halt 31 and bottom half 32. An inwardly angled surface 36 extends from the top surface 31a to a vertical edge surface 36a, which is between the angled surface 36 and the bottom surface 31b. An angled surface 37 extends in the bottom half 32 from the bottom surface 32b to a ledge 37c in the bottom half 32. A vertical edge surface 37d is between the ledge 37c and the angled surface 37. An angled surface 37e extends from the top surface 32a to the ledge 32c. The opening formed by the circular ledge 32c is less than the diameter of the disk 35 end therefore the disk 35 rests on the ledge 32c. The disk 35 is captured between the top half 31 and bottom half 32. The disk 35 sits on the ledge 32c and the top surface of the disk is even with the top surface of the bottom half 32. As can be seen, the disk 35 is approximately in the middle between the tray halves but is farther from the top surface 31a and closer to the bottom surface 32b, due to the bottom surface having a recess to contain the disk. The vertical edges 36a and 37d are in vertical alignment with each other. The top half 31 is separated from the bottom half 32 end six disks are placed in the bottom half 32. Then the top half 31 is placed on top of the bottom half 32 and the magnets (not shown) hold the two halves 31, 32 together. As can be seen, the disk 35 is midway between the top surface 31a of the top half 31 and the bottom surface 32b of the bottom half 32. The thickness of each half 31, 32 is approximately 0.12 inches. The thickness of the disk 35 is approximately 0.02 inches. Therefore, the surfaces of the disks 35 are approximately 0.012 inches from the top surface 31a and 0.10 inches from bottom surface 32b. The disks 35 have a central opening 35a. A conical tipped post 38 is secured in, the bottom half 32 and is position in an opening 39 formed in the top half 31. The post 38 and opening 39 form an alignment guide to assure that the halves 31, 32 are properly oriented when assembled. A notch 40 is formed in both halves 31, 32 and is utilized to properly position the disk tray 30 on the carrier 20, as will be described more fully hereafter.

Figure 2:
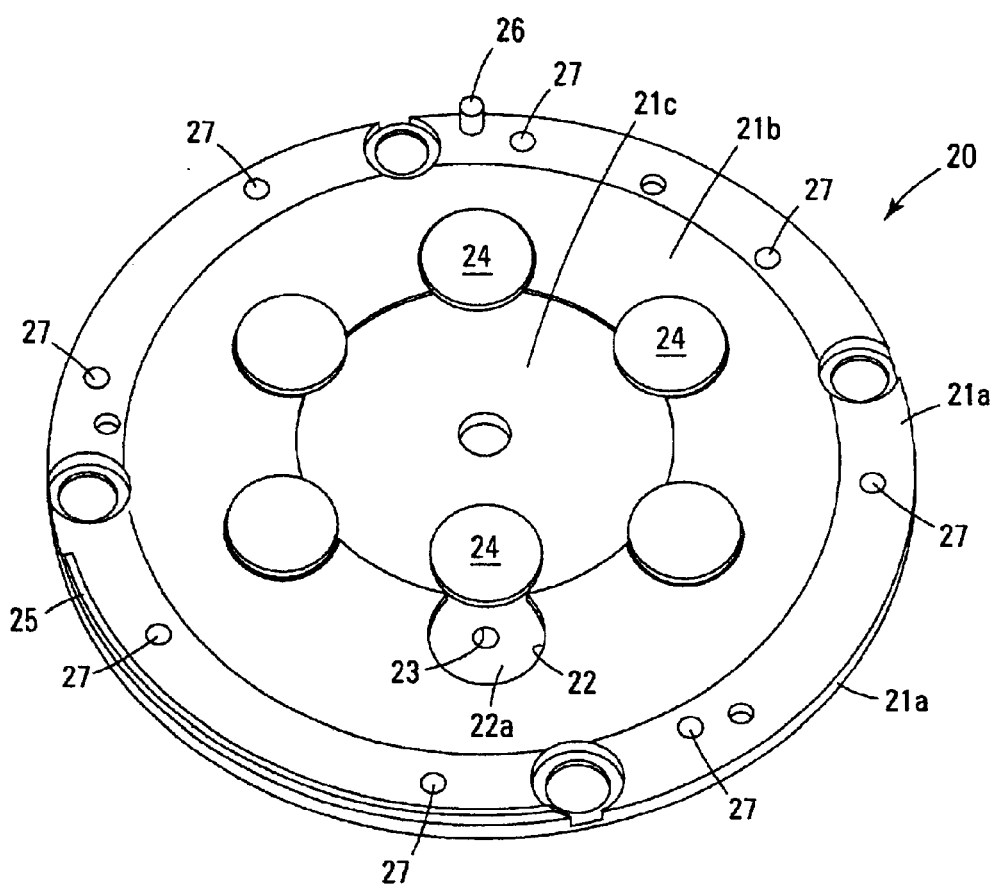
FIG. 2 is a perspective view of the carrier of the present invention.
Figure 3:
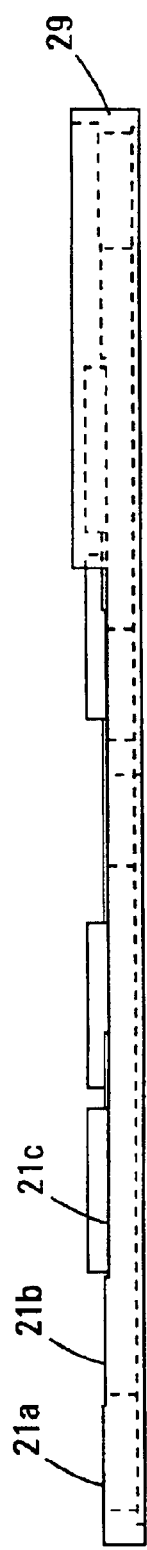
FIG. 3 is a side elevational view of the carrier shown in FIG. 2.
Figure 4:
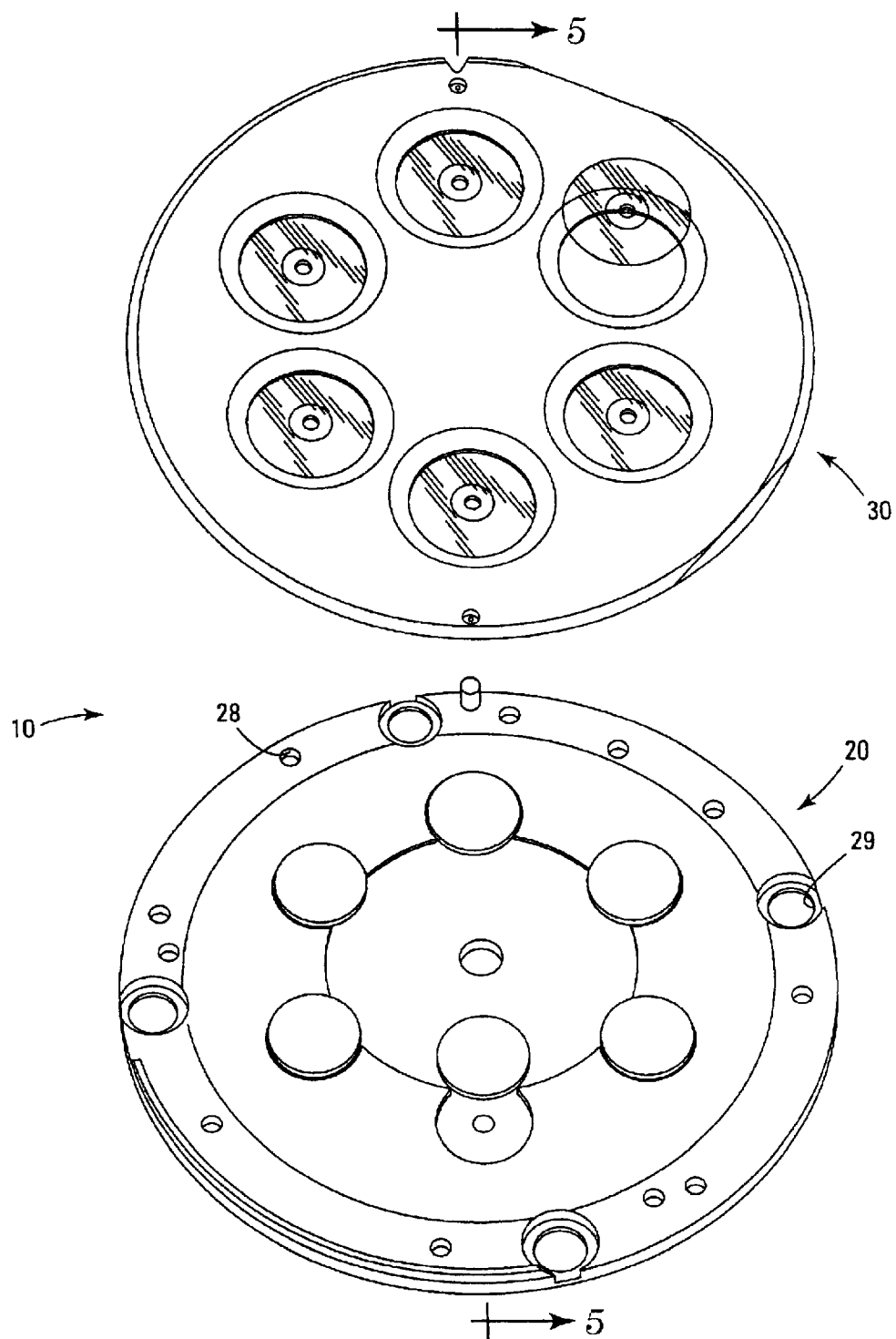
FIG. 4 is an exploded perspective view of both the carrier and disk tray shown in FIGS. 1 and 2.
Figure 6:
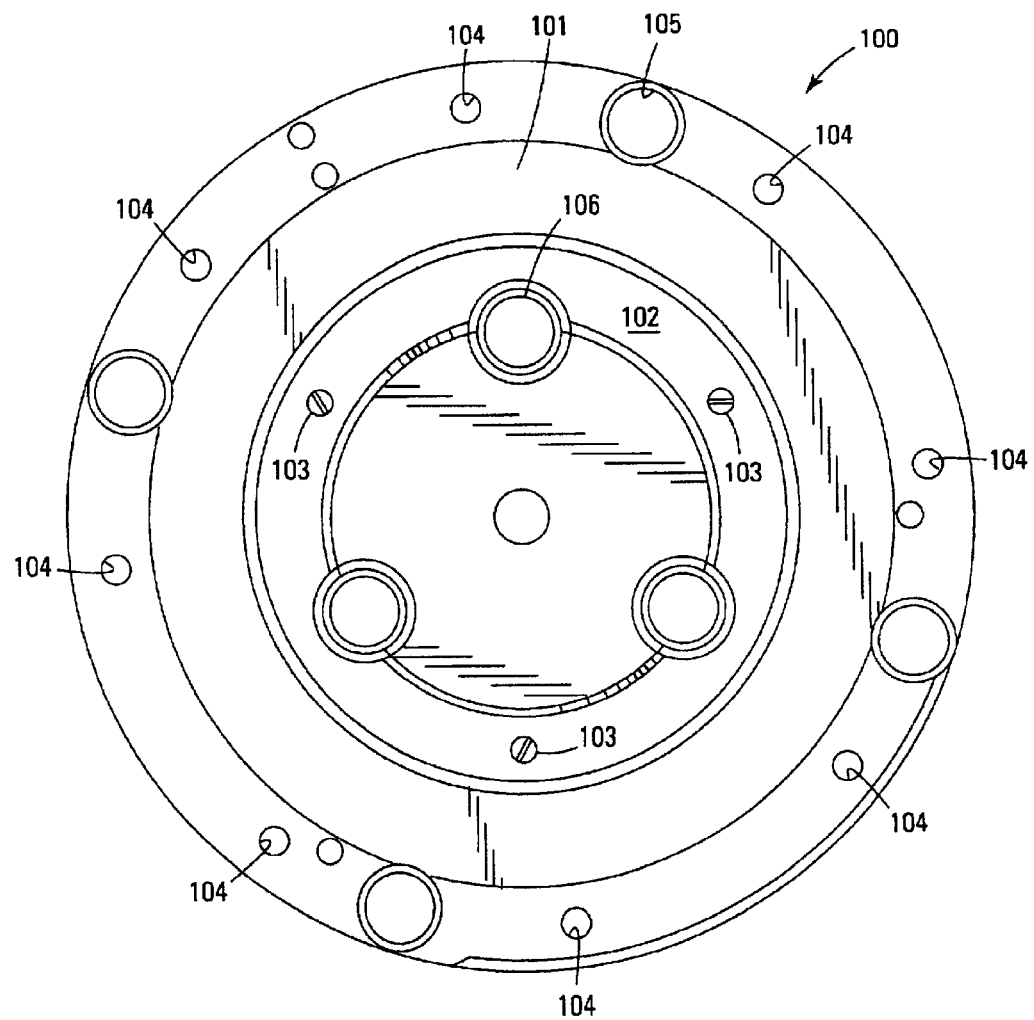
FIG. 6 is a top plan view of a prior art disk carrier.

Referring now to FIGS. 2, 3 and 5, the carrier 20 is shown. The carrier 20 includes a base plate 21. The base plate 21 has a top surface 21a, intermediate surface 21b and lower surface 21c. The intermediate surface is approximately 0.005 inches below the top surface 21a. The lower surface 21c is approximately 0.03 inches below the intermediate surface 21b. The stepped construction is most easily seen in FIG. 3. Six generally cylindrical cavities 22 having an open top are formed in the intermediate surface 21b and the cavities have a bottom 22a. The bottom 22a is coplanar with the lower surface 21c. Embedded and secured in the bottoms 22a are magnets 23. Six circular shields 24 in the general shape of a disk are positioned in the cavities 22 and are releasably connected to the carrier 20 by the magnetic force provided by the magnets 23. The cavities 22 are formed around a circle and each of the shields 24 are directly underneath an opening 35a of the disk 35. The shields 24 are sized and configured to be positioned in the cavities 22. The shields are formed from a suitable magnetic material, such as stainless steel, to be attracted to the magnets 23. Alternately, the shields could be magnetic and there would not be the need for the magnets 23, as the shields 24 would provide the magnetic attractive force. The cavity has a diameter slightly larger than the shields 24 diameter to allow for insertion into the cavity. The walls of the cavity 22 prevent horizontal movement, except for the amount clearance between the shield 24 and cavity 22. A ridge 25 is provided on the outer circumference of the carrier 20 and provides for a positioning surface for the disk tray 30. A positioning post 26 is secured in the base 21 and extends upward. The post 26 cooperates with the notch 40 to provide for the correct positioning of the disk tray 30. Magnets 27 are secured in holes 28 in the carrier 20. The magnets 27 are not shown in FIG. 4 in order to depict the holes 28. However, it is understood that the magnets 27 would be secured to the carrier 20, as shown in FIG. 2. Openings 29 are provided to secure the carrier to the coater (not shown).

In operation, the top half 31 is separated from the bottom half 32 and six disks 35 placed in the openings 34. The disk tray 30 is then reassembled, capturing the disks 35. The loaded disk tray 30 is then brought to the coater (not shown) and placed on the carrier 20. The carrier 20 is mounted in the coater, by means well known in the art. The magnets 27 secure the disk tray 30 to the carrier 20. At this time, all of the shields 24 are in position and hold in place by the magnets 23. The center of the shields 24 are immediately below the central opening 35a of the disk 35. Therefore, the spray pattern of the sputtering that goes through the central opening 35 is contained on the shields 24. The shields have a circular shape of a disk which matches the conical spray pattern of the sputtering through the openings 36a. Further, as can be seen in FIG. 5, the top surface 24 a of the shield 24 extends into the opening 34 formed by the angled surface 37. At this point, the top surface 24a is approximately 0.08 inches from the bottom of the disk 35. When the tray is flipped in the coater the distance is approximately 0.08 inches. In the prior art, the shield 102 is at the intermediate level and would be at the distance the intermediate surface 21b is from the disk 35. By being able to protrude into the opening 34, the shield 24 is able to be closer to the disk 35 and therefore the sputtering pattern that goes through the opening 35a is smaller when it contacts the shield 24. The sputtering pattern is typically in a conical shape and would grow larger, the farther the shield 24 is from the disk 35. The fact that the shield 24 is able to be closer to the disc 35 reduces the size of the pattern that results on the shield 24. Therefore, the shield 24 more effectively captures all of the sputtering. Also, the shield 24 has a diameter which is larger than the width of the prior art ring shields and therefore again more effectively captures the sputtering pattern. The diameter of the circular shields 24 is approximately 0.80 inches. The shield 24 has a thickness of 0.10.

Then, when the shields 24 have a buildup of the thin film coating that has gone through the central openings 35, the shields 24 can be easily replaced. The shields 24 are releasably connected to the carrier 20 by the magnetic force of the magnet 23. They may easily be pulled off without the use of tools. When discussed in this application, the fact that the shields 24 are releasably connected refers to the shields being operatively connected to the carrier and able to be released from the carrier without the necessity of using a tool. The shields 24 are easily removable by simply finger pressure. Further, when the maintenance of replacing the shields 24 is performed, it is possible to do so when the disk tray 30 is in the coater. The disk tray 30 can simply be cycled through the coater without any disks 35. Then maintenance can be done by reaching through the openings 34 and removing the shields 24 as the size of the shields is smaller than the openings 34 to allow the shields 24 to be removed through the openings 34. The shields 24 can then be replaced through the same openings 34. This makes the maintenance easier by not having to have the disk trays removed when replacing the shields 24.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A carrier for use in thin film coating of disks, the disks held in a disk tray, the disks having a center opening through which the thin film coating can go through, the carrier comprising:
    a) a base plate for receiving the disk tray;
    b) a plurality of discrete shields, said shields positioned in alignment with the center opening of the disks; and
    c) the shields releasably connected to the base plate.

2. The carrier of claim 1, further comprising the shields are releasably connected by a magnetic force.

3. The carrier of claim 2, further comprising a plurality of magnets operatively connected to the carrier.

4. The carrier of claim 3, further comprising the shields are arranged in a circular pattern on the base plate.

5. The carrier of claim 4, further comprising a plurality of cavities formed in the carrier, the plurality of cavities sizes and configures to receive the shields and the plurality of magnets positioned in the plurality of cavities.

6. The carrier of claim 1, further comprising the shields are circular.

7. A carrier and disk tray combination, the disk tray for holding a plurality of disks for thin film coating, the disks having a center opening, the combination comprising:
    a) a disk tray having a plurality of openings for receiving the disks;
    b) a carrier for holding the disk tray during coating; and
    c) a plurality of discrete shields releasably connected to the carrier, the shields positioned in alignment with the center opening of the disks, wherein a spray pattern of sputtering during coating is received on the shields.

8. The combination of claim 7, further comprising the shields are releasably connected by a magnetic force.

9. The combination of claim 8, further comprising a plurality of magnets operatively connected to the carrier.

10. The combination of claim 9, further comprising the shields are arranged in a circular pattern on the carrier.

11. The combination of claim 10, further comprising a plurality of cavities formed in the carrier, the plurality of cavities sizes and configures to receive the shields and the plurality of magnets positioned in the plurality of cavities.

12. The combination of claim 11, further comprising the shields are circular.

13. The combination of claim 7, further comprising:
    a) the disk tray having a bottom surface and the disks being held in a position above the bottom surface;
    b) the carrier having a top surface, the top surface adjacent the bottom surface of the disk tray;
    c) the shields having a bottom surface releasably connected to the top surface of the carrier and the shields having a top surface, said top surface extending beyond the bottom surface of the disk tray, wherein the spray pattern is reduced in size due to close proximity of the shields to the disks.

14. A carrier and disk tray combination, the disk tray for holding a plurality of disks for thin film coating, the disks having a center opening, the combination comprising:
    a) a disk tray having a plurality of openings for receiving the disks;
    b) a carrier for holding the disk tray during coating;
    c) a plurality of discrete shields releasably connected to the carrier, the shields positioned in alignment with the center opening of the disks, wherein a spray pattern of sputtering during coating is received on the shields; and
    d) the shields are sized less than the openings in the disk tray, wherein the shields are replaceable when the carrier and disk tray combination is assembled.

15. The combination of claim 14, further comprising the shields are releasably connected by a magnetic force.

16. The combination of claim 15, further comprising a plurality of magnets operatively connected to the carrier.

17. The combination of claim 16, further comprising a plurality of cavities formed in the carrier, the plurality of cavities sizes and configures to receive the shields and the plurality of magnets positioned in the plurality of cavities.

18. A method of replacing shields on a carrier of a thin film coater, the carrier for holding a disk tray during coating, the disk tray having a plurality of openings to hold a plurality of disks, each disk having a central opening, the method comprising:
    a) releasably connecting a plurality of shields to the carrier, the shields in alignment with the central openings of the disks;
    b) loading the disk tray, with disks, onto the carrier;
    c) coating the disks and having the shields collecting the coating going through the central openings;
    d) loading a disk tray, without disks, onto the carrier;
    e) moving the carrier and disk tray into the coater;
    f) reaching in through the openings of the disk tray and removing the shields; and
    g) replacing the plurality of shields with coating with a second plurality of shields with no coating and releasably connecting the second plurality of shields to the carrier.

19. The method of claim 18, wherein the releasably connecting is by magnetic force.

* * * * *